US012635187B2

(12) United States Patent
Toh et al.

(10) Patent No.: US 12,635,187 B2
(45) Date of Patent: May 19, 2026

(54) SEMICONDUCTOR MEMORY STRUCTURE WITH CONTACT PASSING THROUGH OPENING IN CONTROL GATE

(71) Applicant: United Microelectronics Corp., Hsinchu (TW)

(72) Inventors: Boon Keat Toh, Singapore (SG); Chih-Hsin Chang, Hsinchu County (TW); Szu Han Wu, Hsinchu City (TW); Chi Ren, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 363 days.

(21) Appl. No.: 18/327,081

(22) Filed: Jun. 1, 2023

(65) Prior Publication Data

US 2024/0355936 A1 Oct. 24, 2024

(30) Foreign Application Priority Data

Apr. 21, 2023 (TW) .................................. 112114887

(51) Int. Cl.
| | |
|---|---|
| *H10D 30/68* | (2025.01) |
| *H10B 41/35* | (2023.01) |
| *H10D 30/01* | (2025.01) |
| *H10D 62/83* | (2025.01) |
| *H10D 64/62* | (2025.01) |

(52) U.S. Cl.
CPC ............. *H10D 30/68* (2025.01); *H10B 41/35* (2023.02); *H10D 30/022* (2025.01); *H10D 30/0411* (2025.01); *H10D 62/83* (2025.01); *H10D 64/62* (2025.01)

(58) Field of Classification Search
CPC ...... H10D 30/68; H10D 30/00; H10D 30/022; H10D 30/0411
See application file for complete search history.

(56) References Cited

U.S. PATENT DOCUMENTS

| | | | |
|---|---|---|---|
| 9,299,712 B2 | 3/2016 | Tempel et al. | |
| 9,837,425 B2 | 12/2017 | Chen et al. | |
| 2020/0020709 A1* | 1/2020 | Lin ...................... | G11C 29/006 |
| 2022/0359674 A1* | 11/2022 | Cho ...................... | H10B 41/35 |

* cited by examiner

*Primary Examiner* — Wasiul Haider
(74) *Attorney, Agent, or Firm* — JCIPRNET

(57) ABSTRACT

Provided are a semiconductor device and a manufacturing method thereof. The semiconductor device includes a substrate having a first memory region. The first memory region includes a first dielectric layer, a first floating gate, a first inter-gate dielectric layer, a control gate and a first contact. The first dielectric layer is disposed on the substrate. The first floating gate is disposed on the first dielectric layer. The first inter-gate dielectric layer is disposed on the first floating layer. The control gate is disposed on the first inter-gate dielectric layer. The first contact penetrates through the first control gate and the first inter-gate dielectric layer and is landed on the first floating gate.

9 Claims, 15 Drawing Sheets

SEMICONDUCTOR MEMORY STRUCTURE WITH CONTACT PASSING THROUGH OPENING IN CONTROL GATE

CROSS-REFERENCE TO RELATED APPLICATION

This application claims the priority benefit of Taiwan application serial no. 112114887, filed on Apr. 21, 2023. The entirety of the above-mentioned patent application is hereby incorporated by reference herein and made a part of this specification.

BACKGROUND

Technical Field

The present disclosure relates to an integrated circuit and a method of manufacturing the same, and particularly to a semiconductor device and a method of manufacturing the same.

Description of Related Art

In recent years, the size of a semiconductor device has been gradually reduced. The reduction of critical dimension, the improvement of rate and efficiency, and the improvement of device integration are all important goals in the semiconductor technology. The size (such as a thickness) of a semiconductor device usually has a considerable impact on the electrical properties and performance of the semiconductor device. Therefore, real-time monitoring of the electrical properties of the semiconductor device is required to ensure the performance of the semiconductor device.

SUMMARY

The present disclosure provides a semiconductor device and a method of manufacturing the same, in which the method of the disclosure can be integrated with the existing manufacturing process, and the manufactured semiconductor device has a structure capable of monitoring the equivalent oxide thickness (EOT) around the gate in real time, so as to ensure the performance of the semiconductor device.

The disclosure provides a semiconductor device, which includes a substrate having a first memory region. The first memory region includes a first dielectric layer, a first floating gate, a first inter-gate dielectric layer, a control gate and a first contact. The first dielectric layer is disposed on the substrate. The first floating gate is disposed on the first dielectric layer. The first inter-gate dielectric layer is disposed on the first floating layer. The control gate is disposed on the first inter-gate dielectric layer. The first contact penetrates through the first control gate and the first inter-gate dielectric layer and is landed on the first floating gate.

In an embodiment of the present disclosure, the semiconductor further includes a first hard mask layer disposed on the first control gate, wherein the first contact further penetrates through the first hard mask layer.

In an embodiment of the present disclosure, the semiconductor further includes a first spacer disposed between the first control gate and the first contact, and landed on the first floating gate.

In an embodiment of the present disclosure, a top of the first spacer is higher than a top of the first hard mask layer.

In an embodiment of the present disclosure, the first memory region is a dummy memory region.

In an embodiment of the present disclosure, the semiconductor further includes a first word line and a first erase gate disposed on the first dielectric layer, wherein the first floating gate is located between the first word line and the first erase gate, and the first floating gate is separated from the first word line and the first erase gate.

In an embodiment of the present disclosure, the semiconductor further includes a doped region, disposed in the first floating gate below the first contact.

In an embodiment of the present disclosure, the semiconductor further includes a metal silicide layer, disposed between the first contact and the doped region.

In an embodiment of the present disclosure, the substrate further includes a second memory region, wherein the second memory region includes: second dielectric layer disposed on the substrate; a second floating gate disposed on the second dielectric layer; a second gate dielectric layer disposed on the second floating gate; a second control gate disposed on the second gate dielectric layer; and a second contact landed on the second control gate.

In an embodiment of the present disclosure, the substrate further includes a logic region, wherein the logic region includes a gate dielectric layer disposed on the substrate, and a gate disposed on the gate dielectric layer, wherein a top of the gate is lower than a top of the first control gate.

The disclosure further provides a method of manufacturing a semiconductor device. The method includes providing a substrate having a first memory region, In the first memory region, the method includes: forming a first dielectric layer on the substrate; forming a first floating gate on the first dielectric layer; forming a first inter-gate dielectric layer on the first floating gate; forming a first control gate on the first inter-gate dielectric layer; and forming a first contact, the first contact penetrating through the first control gate and the first inter-gate dielectric layer and landed on the first floating gate.

In an embodiment of the present disclosure, the method further includes forming a first hard mask layer on the first control gate, wherein the first contact further penetrates through the first hard mask layer.

In an embodiment of the present disclosure, the method further includes forming a first spacer between the first control gate and the first contact, wherein the first spacer is landed on the first floating gate.

In an embodiment of the present disclosure, the method further includes forming a doped region in the first floating gate below the first contact.

In an embodiment of the present disclosure, the method further includes forming a metal silicide layer between the first contact and the doped region.

The disclosure further provides a method of manufacturing a semiconductor device. A substrate is provided with a first memory region and a logic region. A dielectric layer is formed on the substrate in the first memory region and the logic region. A first floating gate, a first gate dielectric layer, a first control gate, and a first hard mask layer are sequentially formed on the dielectric layer in the first memory region. A conductive layer is formed on the dielectric layer aside the first control gate in the first memory region, and a gate layer is formed on the dielectric layer in the logic region. The conductive layer is patterned to form a first word line aside the first control gate in the first memory region, and a first opening is simultaneously formed in the first hard mask layer. The gate layer is patterned to form a gate in the logic region, and the first opening in the first memory region is simultaneously deepened until the first opening exposes the first gate dielectric layer. Lightly doped regions are formed in the substrate at two sides of the gate in the logic region, and a first doped region is formed in the first floating gate below the first opening in the first memory region. The dielectric layer on the lightly doped regions is removed from the logic region, and the first gate dielectric layer exposed by the first opening is simultaneously removed from the first memory region. Heavily doped regions are formed in the substrate at two sides of the gate in the logic region. Source/drain contacts are formed on the heavily doped regions in the logic region, and a first contact is formed in the first opening in the first memory region, wherein the first contact is landed on the first floating gate.

In an embodiment of the present disclosure, the method further includes during forming the heavily doped regions in the substrate at two sides of the gate in the logic region, forming a second doped region in the first floating gate below the first opening in the first memory region.

In an embodiment of the present disclosure, the method further includes before forming the heavily doped regions in the substrate at two sides of the gate in the logic region, forming a gate spacer on a sidewall of the gate in the logic region, and simultaneously forming a first spacer on a sidewall of the first opening in the first memory region.

In an embodiment of the present disclosure, the method further includes before forming the source/drain contacts and the first contact, forming metal silicide layers on the heavily doped regions in the logic region and on the first floating gate and the first word line in the first memory region.

In an embodiment of the present disclosure, the substrate further includes a second memory region adjacent to the first memory region, the first memory region is a dummy memory region, and the second memory region is an active memory region.

Based on the above, in the present disclosure, with the disposition of a floating gate contact, the equivalent oxide thickness (EOT) of the oxide layer around the floating gate (including the overlying inter-gate dielectric layer, the underlying dielectric layer, and the floating gate spacer) can be monitored in real time, so as to ensure the performance of the semiconductor device.

In order to make the above-mentioned features and advantages of the present disclosure more comprehensible, the following specific embodiments are described in detail with reference to the accompanying drawings.

DESCRIPTION OF THE EMBODIMENTS

Embodiments are provided below and described in detail with accompanying drawings, but the provided embodiments are not intended to limit the scope of the present disclosure. In addition, the drawings are provided for illustration purposes only and are not drawn to original scale. In order to facilitate understanding, the same or similar elements are labelled with the same or similar symbols in the following description.

Terms such as "comprising", "including", and "having" mentioned in this specification are all open-ended terms, which means "including but not limited to".

When terms such as "first", "second", etc. are used to describe elements, they are only used to distinguish these elements from each other and do not limit the order or importance of these elements. Therefore, in some cases, a first element may also be called a second element, and a second element may also be called a first element, without departing from the scope of the present disclosure.

FIG. 1 to FIG. 15 are schematic cross-sectional views of a method of manufacturing a semiconductor device according to an embodiment of the present disclosure.

Figure 1:
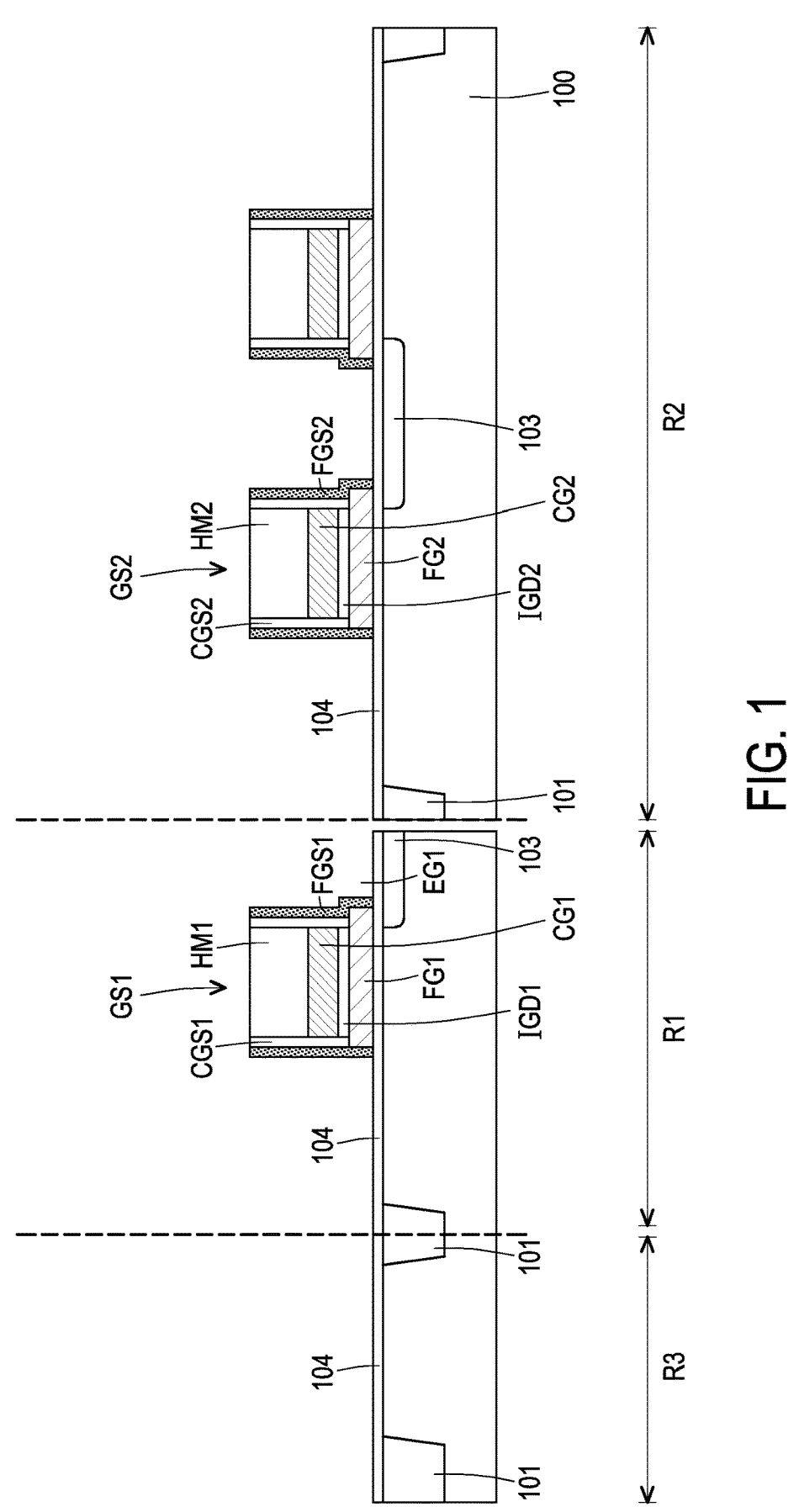
FIG. 1 to FIG. 15 are schematic cross-sectional views of a method of manufacturing a semiconductor device according to an embodiment of the present disclosure.

Referring to FIG. 1, a substrate 100 is provided. The substrate 100 includes a semiconductor substrate, such as a silicon substrate. In an embodiment, the substrate 100 has a memory region R1, a memory region R2 and a logic region R3. Multiple shallow trench isolation structures 101 are disposed in the substrate 100, and configured to define a memory region R1, a memory region R2 and a logic region R3, and define multiple device areas in each region.

In an embodiment, the memory region R2 is an active memory region for active memory devices. The logic region R3 is a region for logic devices. In an embodiment, the memory region R1 is a transition region between the memory region R2 and the logic region R3, as shown in FIG. 1. However, the present disclosure is not limited thereto. In another embodiment, the memory region R1 may be a peripheral memory region surrounding the active memory region R2; that is, the memory region R2 is disposed between the memory region R1 and the logic region R3. Through the specification, the memory region R1 is also called a dummy memory region or a test key region.

In an embodiment, a dielectric layer 104 is formed on the substrate 100 in the memory region R1, the memory region R2 and the logic region R3. The dielectric layer 104 includes silicon oxide, and the forming method thereof includes thermal oxidation. In an embodiment, the dielectric layer 104 on the memory region R1, the memory region R2 and the logic region R3 has the same thickness. However, the present disclosure is not limited thereto. In another embodiment, the thickness of the dielectric layer 104 on the memory region R1 and the memory region R2 is different from (e.g., greater than or smaller than) the thickness of the dielectric layer 104 on the logic region R3.

In an embodiment, at least one stack structure GS1 is formed on the dielectric layer 104 in the memory region R1. Each stack structure GS1 includes, from bottom to top, a floating gate FG1, an inter-gate dielectric layer IGD1, a control gate CG1 and a hard mask layer HM1. In an embodiment, the sidewalls of the dielectric layer IGD1, the control gate CG1 and the hard mask layer HM1 are substantially flushed with each other, and the sidewall of the floating gate FG1 is protruded from the sidewall of the control gate CG1. Each stack structure GS1 further includes a control gate spacer CGS1, which is disposed on the sidewalls of the dielectric layer IGD1, the control gate CG1 and the hard mask layer HM1, and is landed on the top surface of the floating gate FG1. In an embodiment, one sidewall (e.g., right sidewall in FIG. 1) of the floating gate FG1 is protruded from one sidewall (e.g., right sidewall in FIG. 1) of the control gate spacer CGS1, while another sidewall (e.g., left sidewall in FIG. 1) of the floating gate FG1 is substantially flushed with another sidewall (e.g., left sidewall in FIG. 1) of the control gate spacer CGS1. Each stack structure GS1 further includes a floating gate spacer FGS1 disposed on the sidewalls of the floating gate FG1 and the control gate spacer CGS1. In an embodiment, a doped region 103 is located in the substrate 100 at one side of the stack structure GS1. When the memory region R1 has two stack structures GS1, a doped region 103 is located in the substrate 100 between the two stack structures GS2, and the two stack structures GS1 are disposed symmetrically with respect to the doped region 103. The doped region 103 can serve as a source region of the memory device.

In an embodiment, at least one stack structure GS2 is formed on the dielectric layer 104 in the memory region R2. Each stack structure GS2 includes, from bottom to top, a floating gate FG2, an inter-gate dielectric layer IGD2, a control gate CG2 and a hard mask layer HM2. In an embodiment, the sidewalls of the dielectric layer IGD2, the control gate CG2 and the hard mask layer HM2 are substantially flushed with each other, and the sidewall of the floating gate FG2 is protruded from the sidewall of the control gate CG2. Each stack structure GS2 further includes a control gate spacer CGS2, which is disposed on the sidewalls of the inter-gate dielectric layer IGD2, the control gate CG2 and the hard mask layer HM2, and is landed on the top surface of the floating gate FG2. In an embodiment, one sidewall of the floating gate FG2 is protruded from one sidewall of the control gate spacer CGS2, and another sidewall of the floating gate FG2 is substantially flushed with another sidewall of the control gate spacer CGS2. Each stack structure GS2 further includes a floating gate spacer FGS2 disposed on the sidewalls of the floating gate FG2 and the control gate spacer CGS2. In an embodiment, a doped region 103 is located in the substrate 100 between two stack structures GS2, and the two stack structures GS2 are disposed symmetrically with respect to the doped region 103. The doped region 103 can serve as a source region of the memory device.

In an embodiment, the floating gates FG1 and FG2 include doped polysilicon, the inter-gate dielectric layers IGD1 and IGD2 include silicon oxide-silicon nitride-silicon oxide composite dielectric layers, the control gates CG1 and CG2 include doped polysilicon, and the hard mask layers HM1 and HM2 include silicon nitride. In an embodiment, the control gate spacers CGS1, CGS1 and the floating gate spacers FGS1, FGS2 may include be a single-layer or have a multi-layer structure. Each of the control gate spacers CGS1, CGS1 and the floating gate spacers FGS1, FGS2 includes silicon oxide, silicon nitride, silicon oxynitride or a combination thereof.

In an embodiment, the stack structure GS1 and the stack structure GS2 can be formed at the same time, and the forming method includes performing an implantation process to form a doped region, performing deposition processes and etching lithography processes to form floating gates, inter-gate dielectric layers, control gates and hard mask layers, and performing a deposition process and an anisotropic etching process to form spacers.

Figure 2:
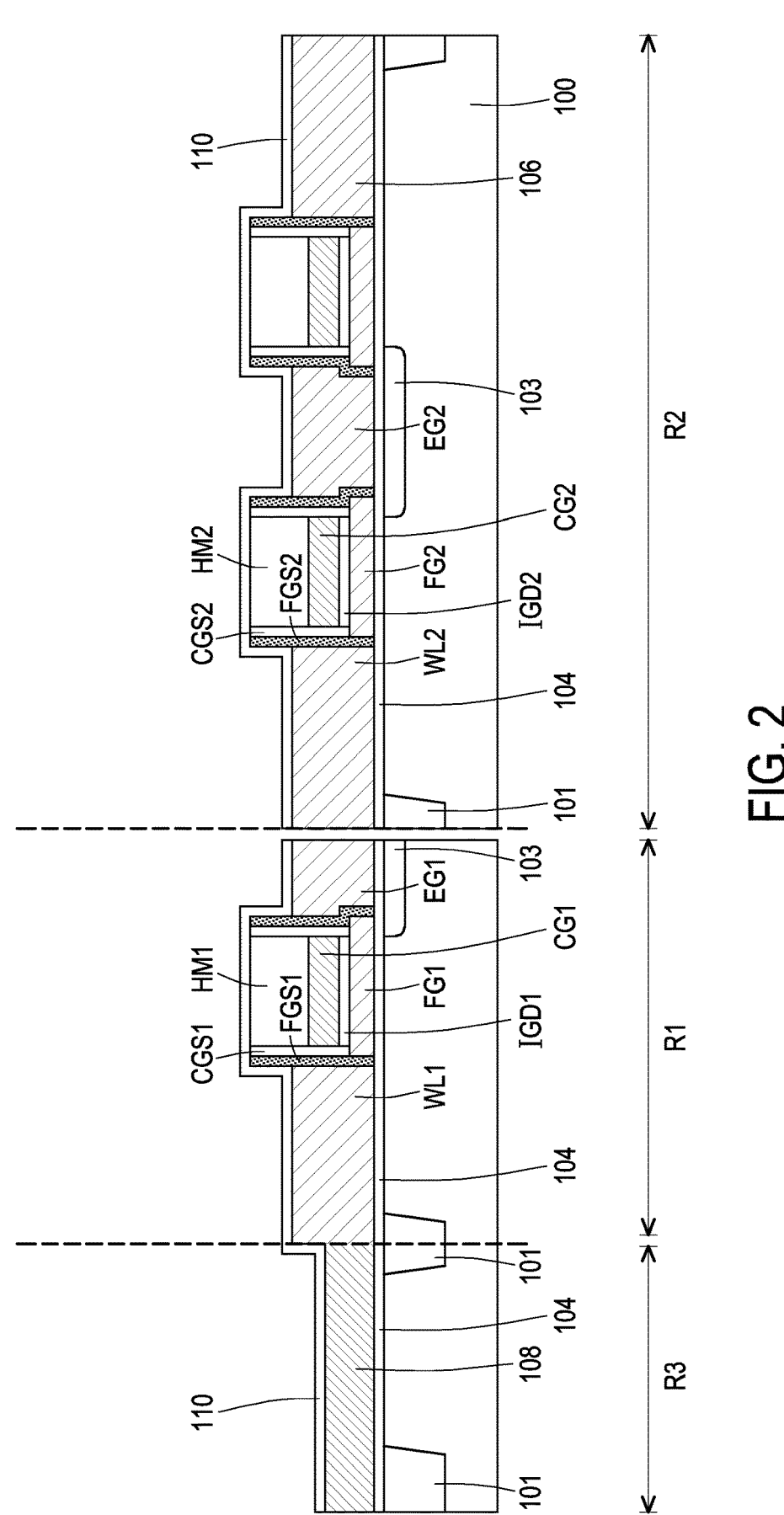

Referring to FIG. 2, a conductive layer 106 is formed on the dielectric layer 104 aside the stack structure GS1 and GS2 in the memory region R1 and the memory region R2, and a gate layer 108 is formed on the dielectric layer 104 in the logic region R3. In an embodiment, the height of the conductive layer 106 is greater than the height of the gate layer 108. In an embodiment, in the memory region R1 and the memory region R2, the top surface of the conductive layer 106 is higher than the top surfaces of the control gates CG1, CG2 but lower than the top surfaces of the hard mask layers HM1, HM2. The conductive layer 106 exposes tops of the control gate spacers CGS1, CGS2, and exposes tops and portions of sidewalls of the floating gate spacers FGS1 and FGS2. The conductive layer 106 and the gate layer 108 may be made by the same material such as doped polysilicon, and the forming method includes chemical vapor deposition.

Thereafter, an insulating layer 110 is formed on the conductive layer 106 and the gate layer 108. In an embodiment, in the memory region R1 and the memory region R2, the insulating layer 110 covers the top surface of the conductive layer 106, the exposed portions of the control gate spacers CGS1, CGS2 and the floating gate spacers FGS1, FGS2, and the top surfaces of the hard mask layers HM1, HM2. The insulating layer 110 includes silicon oxide, and the forming method includes chemical vapor deposition.

Figure 3:
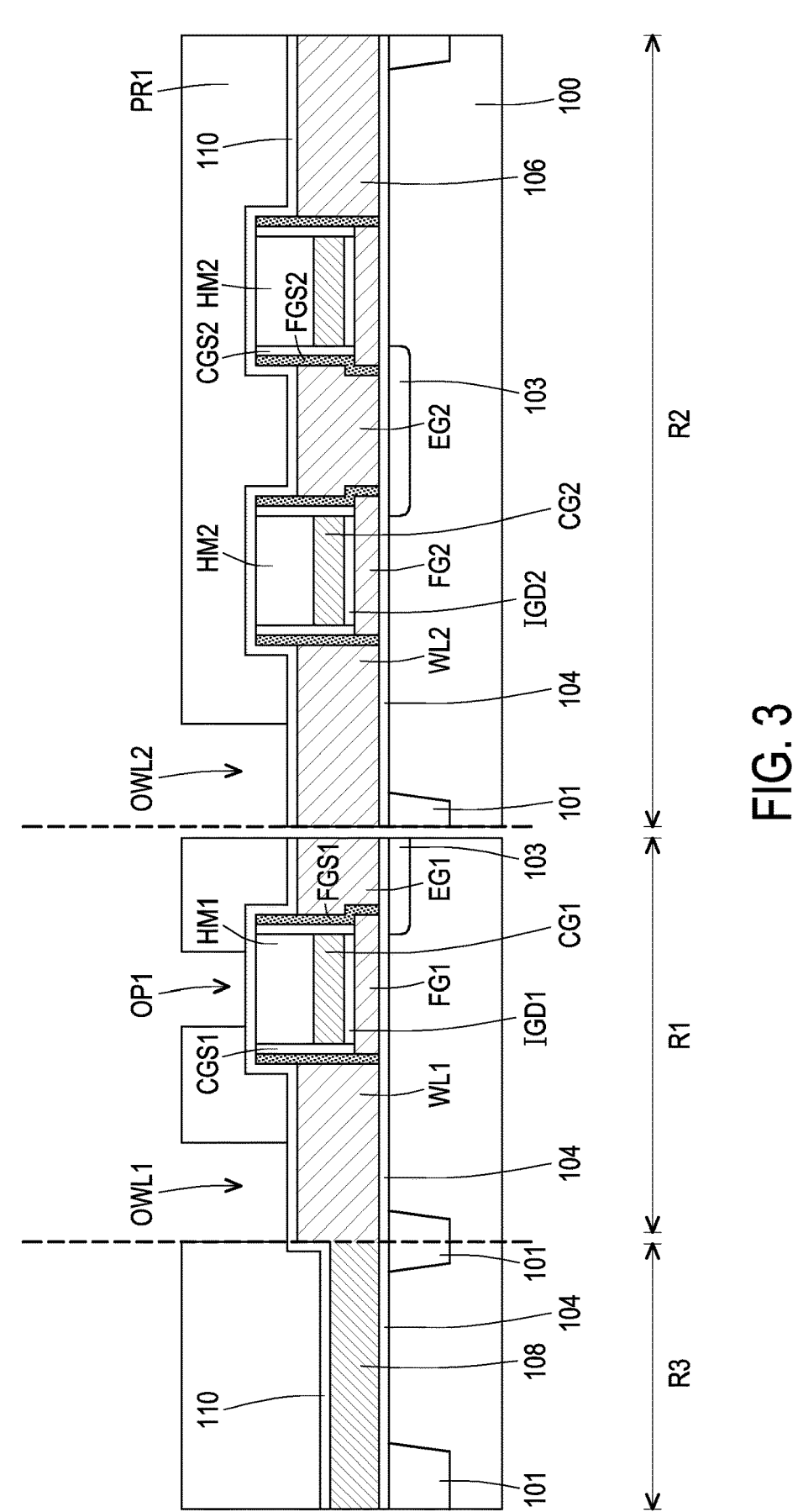
Figure 4:
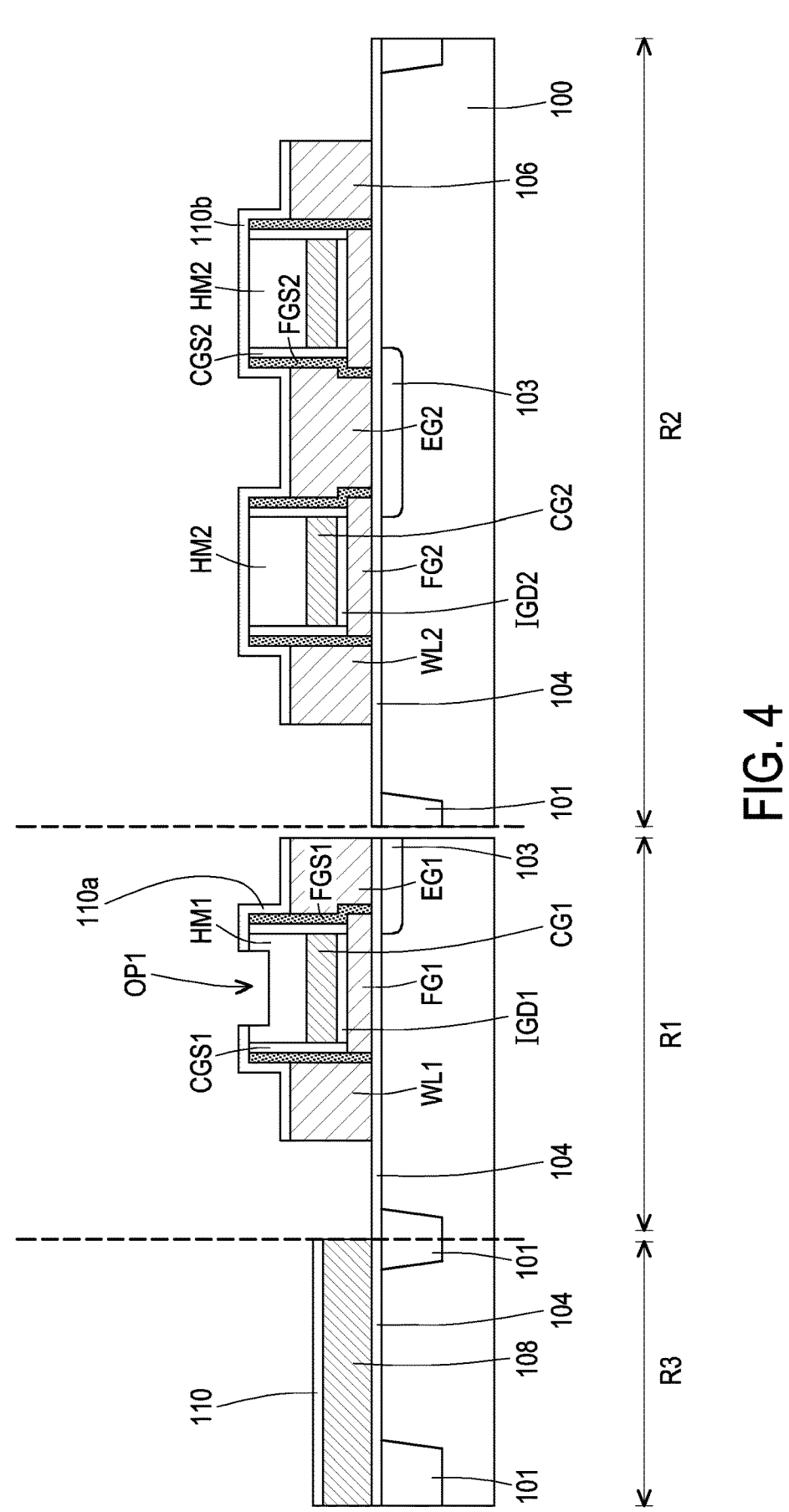

Referring to FIG. 3 and FIG. 4, the conductive layer 106 is patterned to form a word line WL1 aside the floating gate FG1 in the memory region R1 and a word line WL2 aside the floating gate FG2 in the memory region R2, and simultaneously form an opening OP1 in the hard mask layer HM1 in the memory region R1.

Referring to FIG. 3, a patterned photoresist layer PR1 is formed on the substrate 100. In an embodiment, the patterned photoresist layer PR1 has openings OWL1, OWL2 and an opening OP1. The openings OWL1, OWL2 and the opening OP1 are defined by the same photomask and formed by the same lithography process. In an embodiment, in the memory region R1, the patterned photoresist layer PR1 covers an area for defining a word line while the opening OWL1 exposes an area not for defining a word line, and the opening OP1 exposes a portion of the hard mask layer HM1. In an embodiment, in the memory region R2, the patterned photoresist layer PR1 covers an area for defining a word line while the opening OWL2 exposes an area not for defining a word line.

Referring to FIG. 4, an etching process is performed by using the patterned photoresist layer PR1 as a mask, so as to remove portions of the insulating layer 110 and the underlying conductive layer 106, and therefore form an insulating layer 110a and an underlying word line WL1 aside the control gate CG1 in the memory region R1. Similarly, an insulating layer 110b and an underlying word line WL2 are formed aside the control gate CG2 in the memory region R2. In an embodiment, the opening OWL1 and opening OWL2 expose portions of the dielectric layer 104 in memory region R1 and memory region R2. This etching process removes a portion of the hard mask layer HM1 below the opening OP1 at the same time, and transfers the opening OP1 to the hard mask layer HM1. The above etching process includes a dry etching process. After that, the patterned photoresist layer PR1 is removed to form a word line WL1, a word line WL2, and form an opening OP1 in the hard mask layer HM1.

In an embodiment, in the memory region R1, an erase gate EG1 is formed at another side of the control gate CG1, opposite to the word line WL1. In the memory region R1, when two gate stacks are formed on the substrate 100, the erase gate EG1 is formed between the two control gates CG1. In an embodiment, in the memory region R2, the erase gate EG2 is formed between two control gates CG2.

Figure 5:
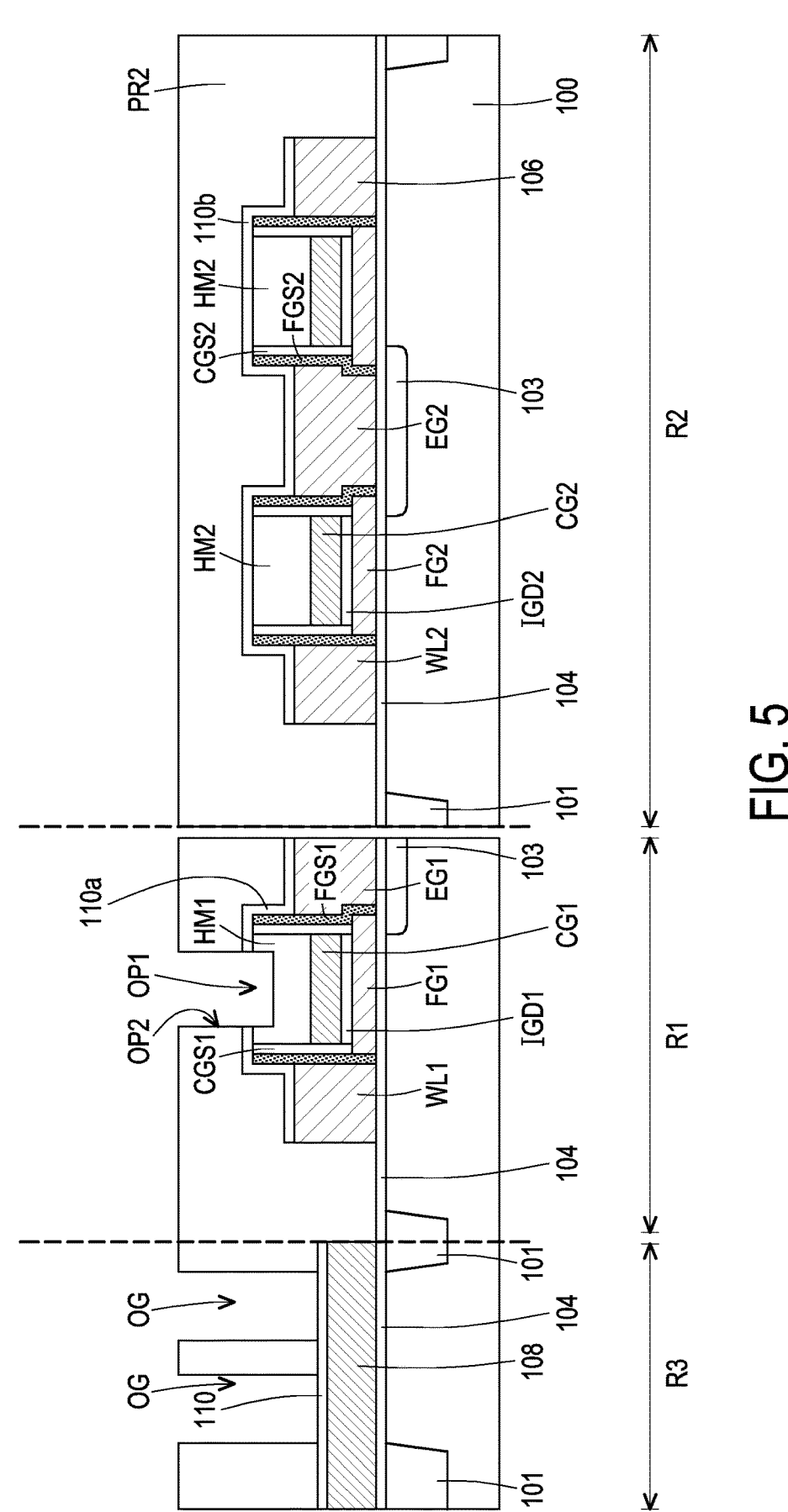
Figure 6:
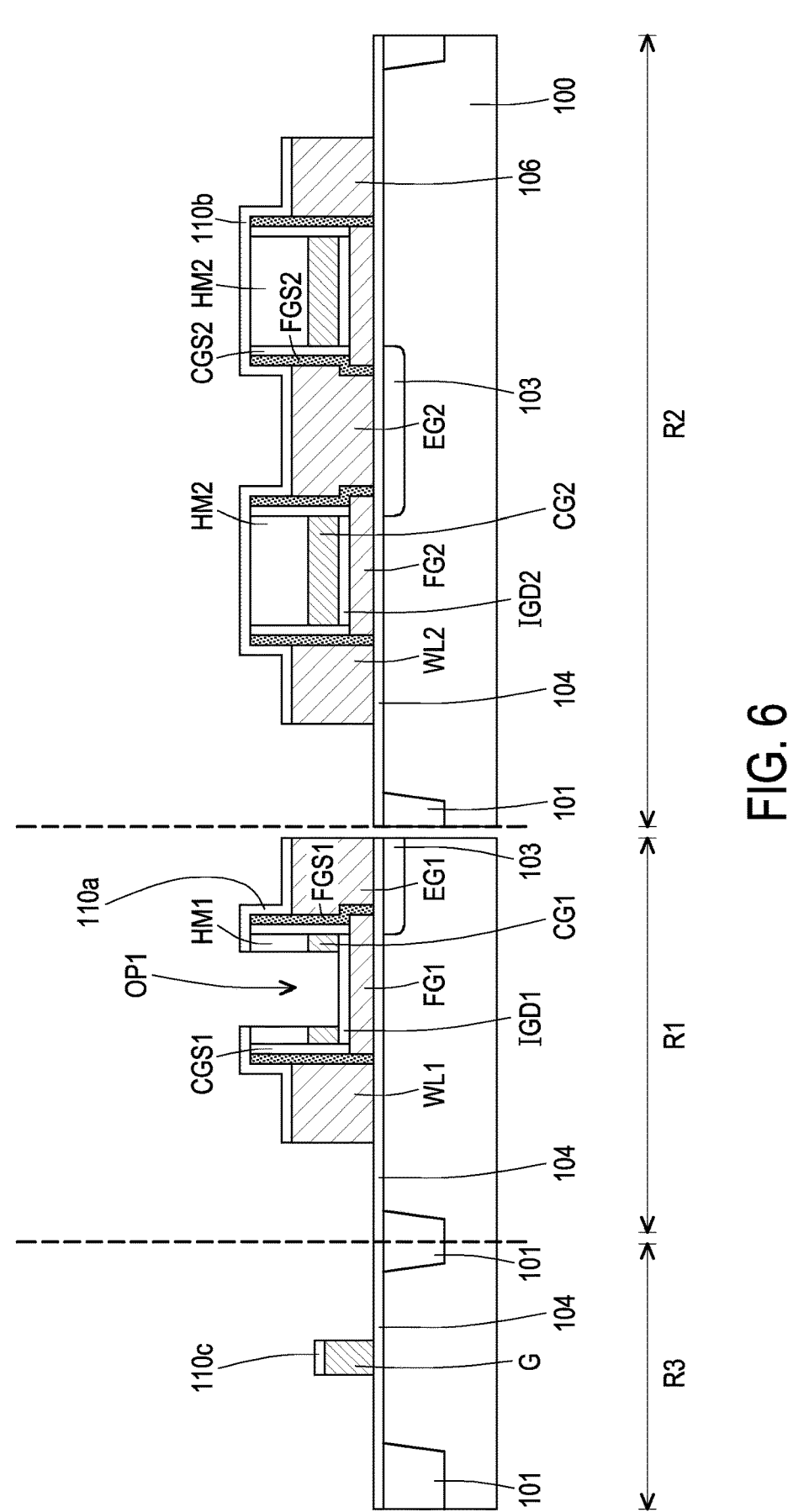

Referring to FIG. 5 and FIG. 6, the gate layer 108 is patterned to form a gate G in the logic region R3, and at the same time, the opening OP1 in the memory region R1 is deepened until the opening OP1 exposes the inter-gate dielectric layer IGD1.

Referring to FIG. 5, a patterned photoresist layer PR2 is formed on the substrate 100. In an embodiment, the patterned photoresist layer PR2 has openings OG and an opening OP2. The openings OG and the opening OP2 are defined by the same photomask and formed by the same lithography process. In an embodiment, in the memory region R1, the opening OP2 is connected to the opening OP1, which can also be regarded as one opening. In an embodiment, the patterned photoresist layer PR2 covers an area for defining a gate in the logic region R3 while the openings OG exposes an area not for defining a gate.

Referring to FIG. 6, an etching process is performed by using the patterned photoresist layer PR2 as a mask, so as to remove portions of the insulating layer 110 and the underlying gate layer 108, and therefore form an insulating layer 110c and an underlying gate G in the logic region R3. In an embodiment, the opening OG exposes a portion of the dielectric layer 104 in the logic region R3. This etching process removes a portion of the hard mask layer HM1 below the opening OP1 at the same time, so that the opening OP1 penetrates through the hard mask layer HM1 and the control gate CG1. The above etching process includes a dry etching process. Afterwards, the patterned photoresist layer PR2 is removed to form a gate G, and the opening OP1 in the hard mask layer HM1 exposes the inter-gate dielectric layer IGD1.

Figure 7:
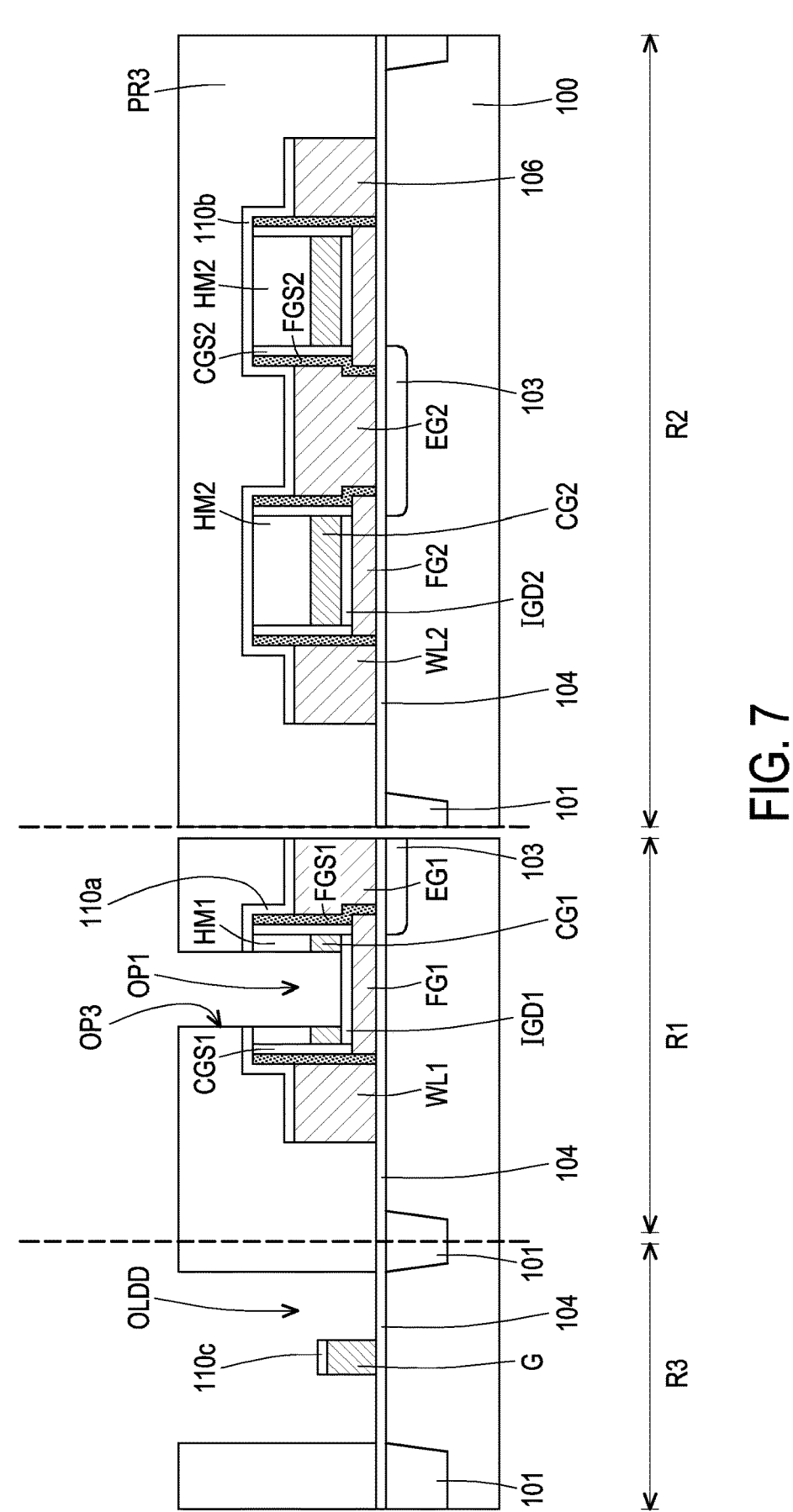

Referring to FIG. 7, a patterned photoresist layer PR3 is formed on the substrate 100. In an embodiment, the patterned photoresist layer PR3 has an opening OLDD and an opening OP3. The opening OLDD and the opening OP3 are defined by the same photomask and formed by the same lithography process. In an embodiment, in the memory region R1, the opening OP3 is connected to the opening OP1, which can also be regarded as one opening. In an embodiment, the opening OLDD exposes an area for defining doped regions in the logic region R3, while covers other areas.

Figure 8:
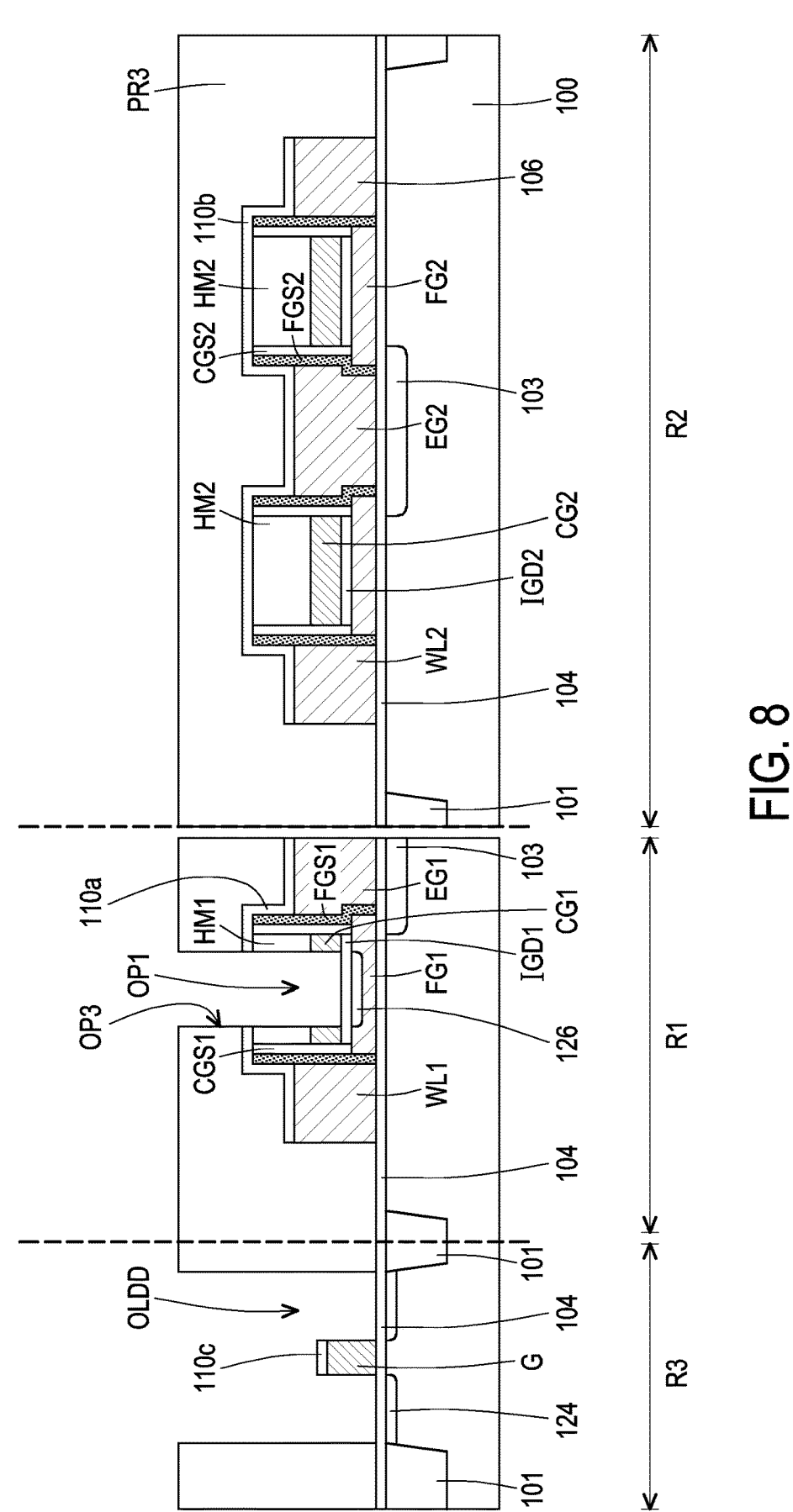

Referring to FIG. 8, an implantation process is performed to form doped regions 124 in the substrate 100 at two sides of the gate G in the logic region R3, and form a doped region 126 in the floating gate FG1 below the opening OP1 in the memory region R1. The doped regions 124 can serve as lightly doped regions of logic devices. The doped region 126 can reduce the resistance between the subsequently formed floating gate contact and the floating gate FG1.

Figure 9:
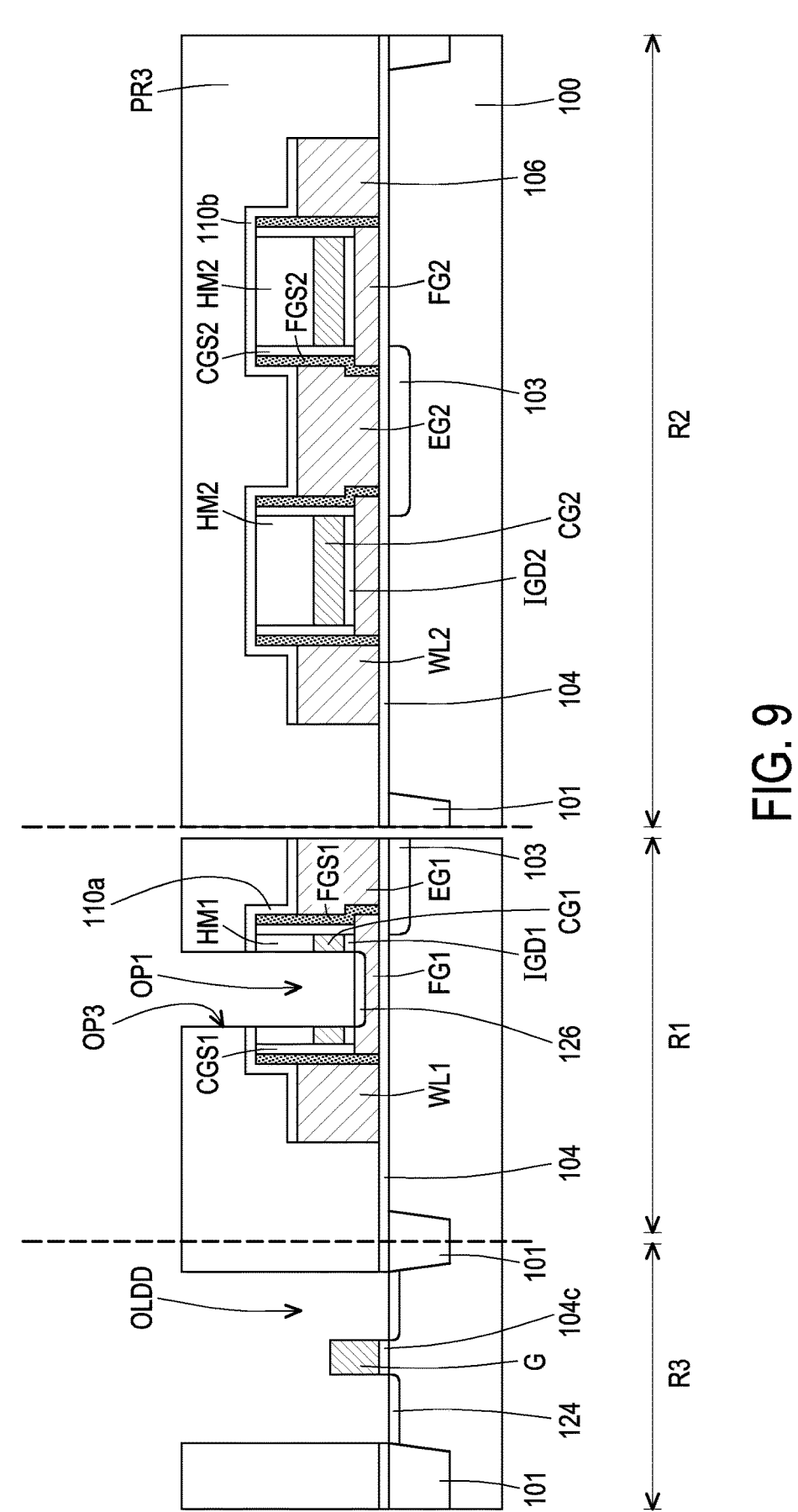

Referring to FIG. 9, an etching process is performed to remove the dielectric layer 104 on the doped regions 124 in the logic region R3, and simultaneously remove the inter-gate dielectric layer IGD1 exposed by the opening OP1 in the memory region R1. In an embodiment, the insulating layer 110c above the gate G in the logic region R3 is also removed. The above etching process includes a dry etching process. After that, the patterned photoresist layer PR3 is removed.

Figure 10:
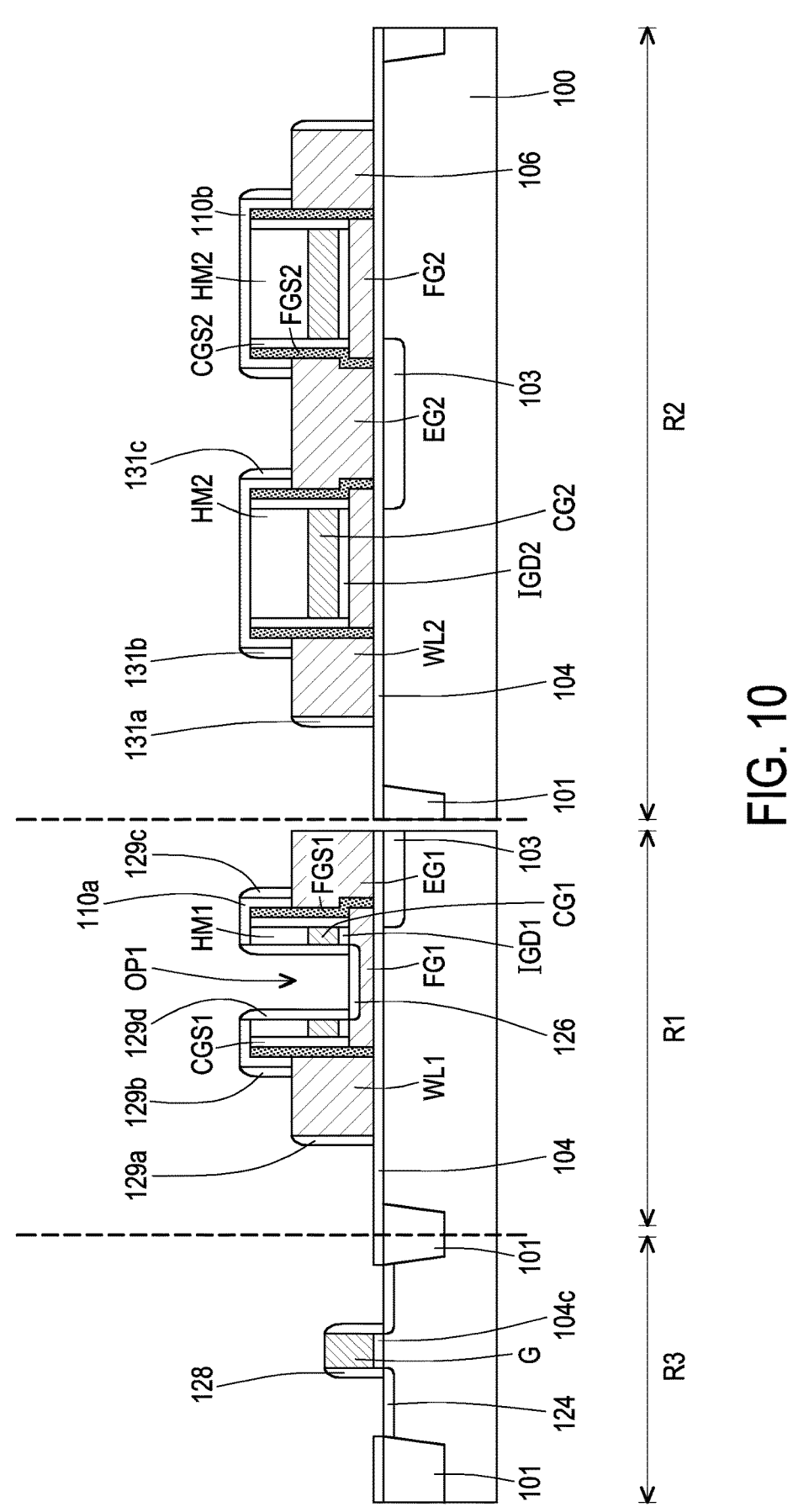

Referring to FIG. 10, a spacer 128 is formed on the sidewall of gate G in logic region R3. At the same time, spacers 129a, 129b, 129c, and 129d are formed in the memory region R1, and spacers 131a, 131b, and 131c are formed in the memory region R2. More specifically, in memory region R1, the spacer 129a is formed on the sidewall of the word line WL1 and landed on the substrate 100, the spacer 129b and the spacer 129c are formed on the opposite sidewalls of the hard mask layer HM1 and landed on the top surfaces of word line WL1 and the erase gate EG1 respectively, and the spacer 129d is formed on the sidewall of the opening OP1 and landed on the top surface of the floating gate FG1. In memory region R2, the spacer 131a is formed on the sidewall of word line WL2 and landed on substrate 100, the spacer 131b and spacer 131c are formed on the opposite sidewalls of the hard mask layer HM2 and landed on the top surfaces of word line WL2 and the erase gate EG2 respectively. The spacers include silicon oxide, silicon nitride, silicon oxynitride or a combination thereof. The method of forming the spacers includes a deposition process and an anisotropic etching process.

Figure 11:
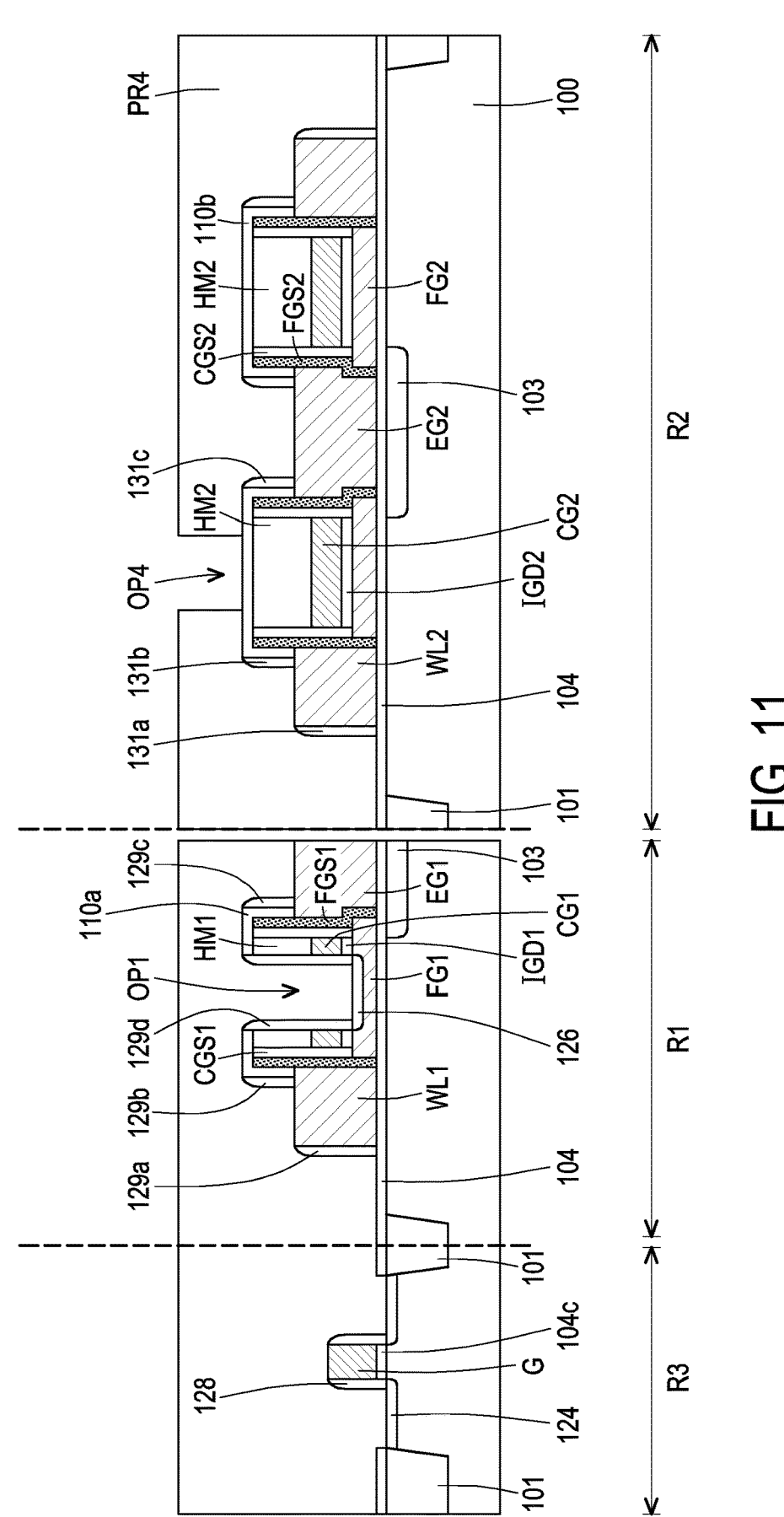

Referring to FIG. 11, a patterned photoresist layer PR4 is formed on the substrate 100. In an embodiment, the patterned photoresist layer PR4 has an opening OP4. In an embodiment, the opening OP4 exposes an area for defining a control gate contact in the memory region R2 while the patterned photoresist layer PR4 covers other areas.

Figure 12:
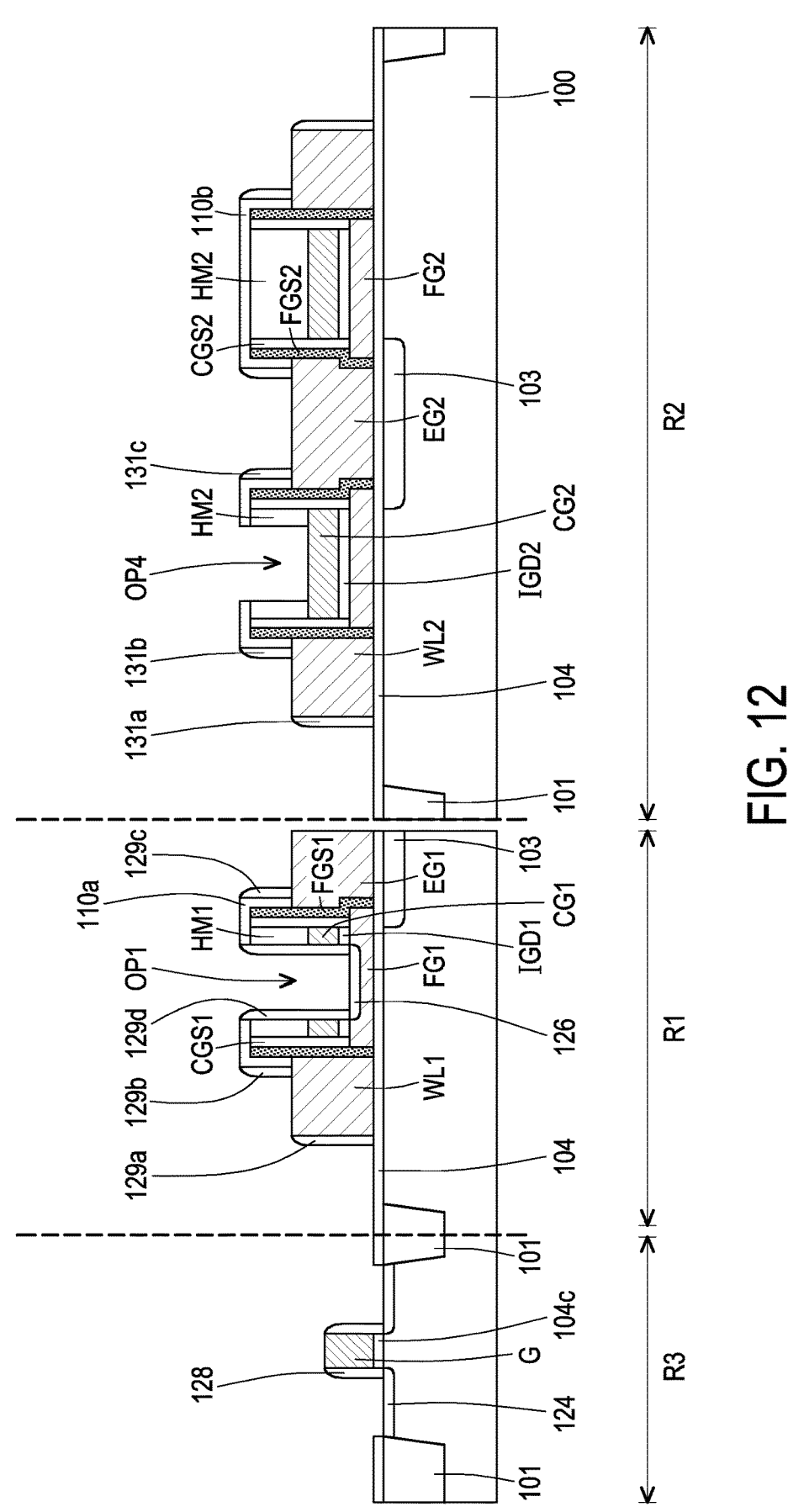

Referring to FIG. 12, an etching process is performed by using the patterned photoresist layer PR4 as a mask, so as to remove a portion of the hard mask layer HM2 below the opening OP4 until the opening OP4 exposes the control gate CG2. The above etching process includes a dry etching process. After that, the patterned photoresist layer PR4 is removed.

Figure 13:
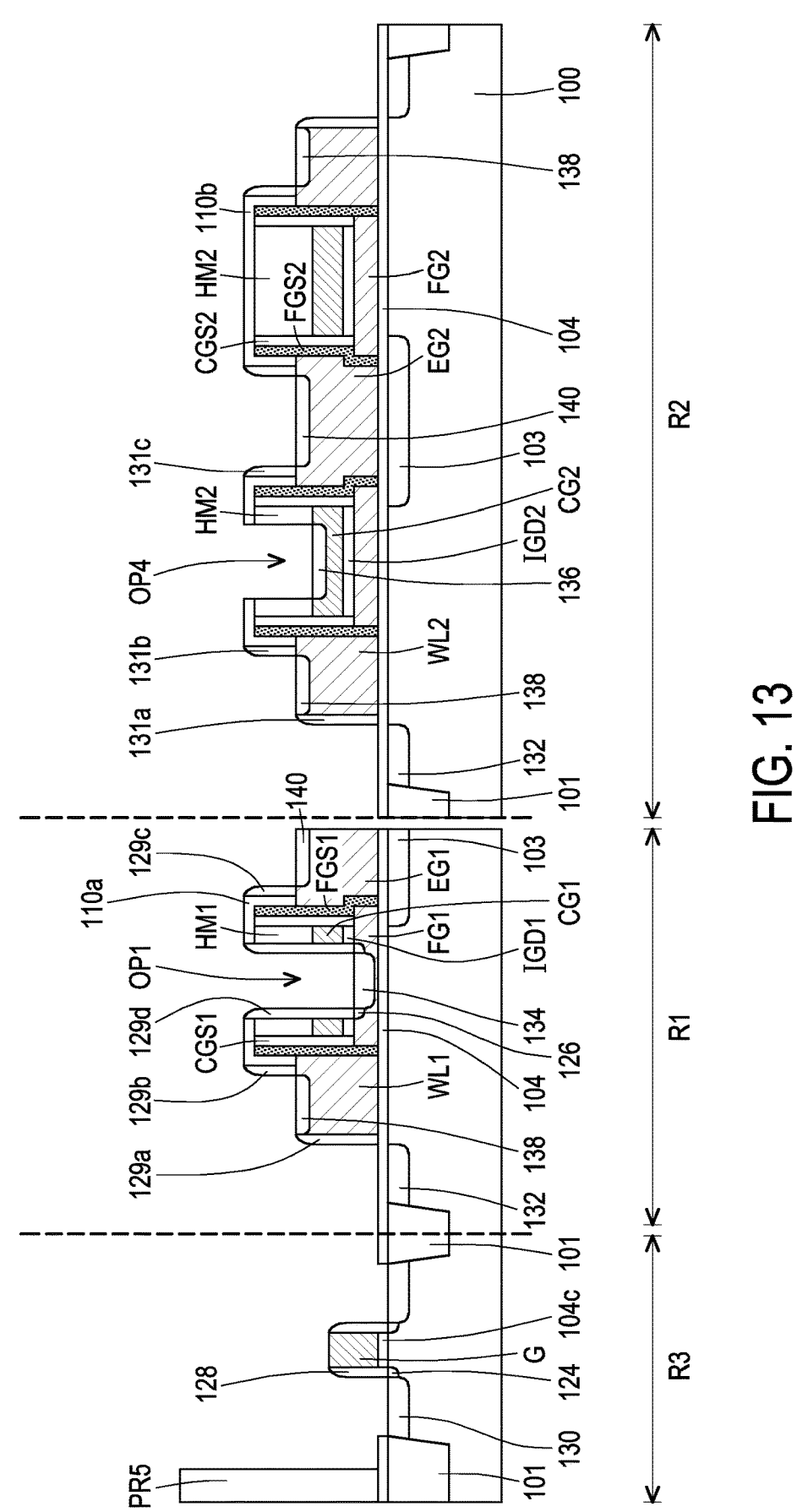

Referring to FIG. 13, doped regions 130 are formed in the substrate 100 at two sides of the gate G in the logic region R3. The doping concentration and depth of the doped regions 130 are greater than the doping concentration and depth of the doped regions 124. The doped regions 130 can serve as source/drain regions of logic devices. During the formation of the doped regions 130, doped regions 132 are formed in the substrate 100 at two sides of the word lines WL1 and WL2 in the memory region R1 and memory region R2. The doped regions 132 can serve as drain regions of the memory device.

During the formation of the doped regions 130, a doped region 134 is formed in the floating gate FG1 exposed by the opening OP1 in the memory region R1, and a doped region 136 is formed in the control gate CG2 exposed by the opening OP4 in the memory region R2. The doped region 134 can reduce the resistance between the subsequently formed floating gate contact and the floating gate FG1, and the doped region 136 can reduce the resistance between the subsequently formed control gate contact and the control gate CG2.

In an embodiment, the doped region 134 is overlapped with the doped region 126, and the dopant concentration and depth of the doped region 134 are higher than the dopant concentration and depth of the doped region 126. It is noted that, the doped region 126 and the doped region 134 are optional, and one of the doped region 126 and the doped region 134 is selected depending on the process requirements. For example, only the doped region 126 is formed in the floating gate FG1. Alternatively, only the doped region 134 is formed in the floating gate FG1.

In addition, during the formation of the doped regions 130, doped regions 138 are formed on tops of the word lines WL1, WL2 of the memory regions R1, R2, and doped regions 140 are formed on tops of the erase gates EG1, EG2 in the memory regions R1, R2. The doped regions 138 can reduce the resistance between the subsequently formed word line contacts and the word lines WL1, WL2, and the doped regions 140 can reduce the resistance between the subsequently formed erase gate contacts and the erase gates EG1, EG2.

The method of forming the above doped regions is a self-aligned implantation process by using spacers as an implant mask. In an embodiment, a patterned photoresist layer PR5 on the left side of FIG. 13 is a mask used to cover another type of CMOS device. After forming the above doped regions, the patterned photoresist layer PR5 is removed.

Figure 14:
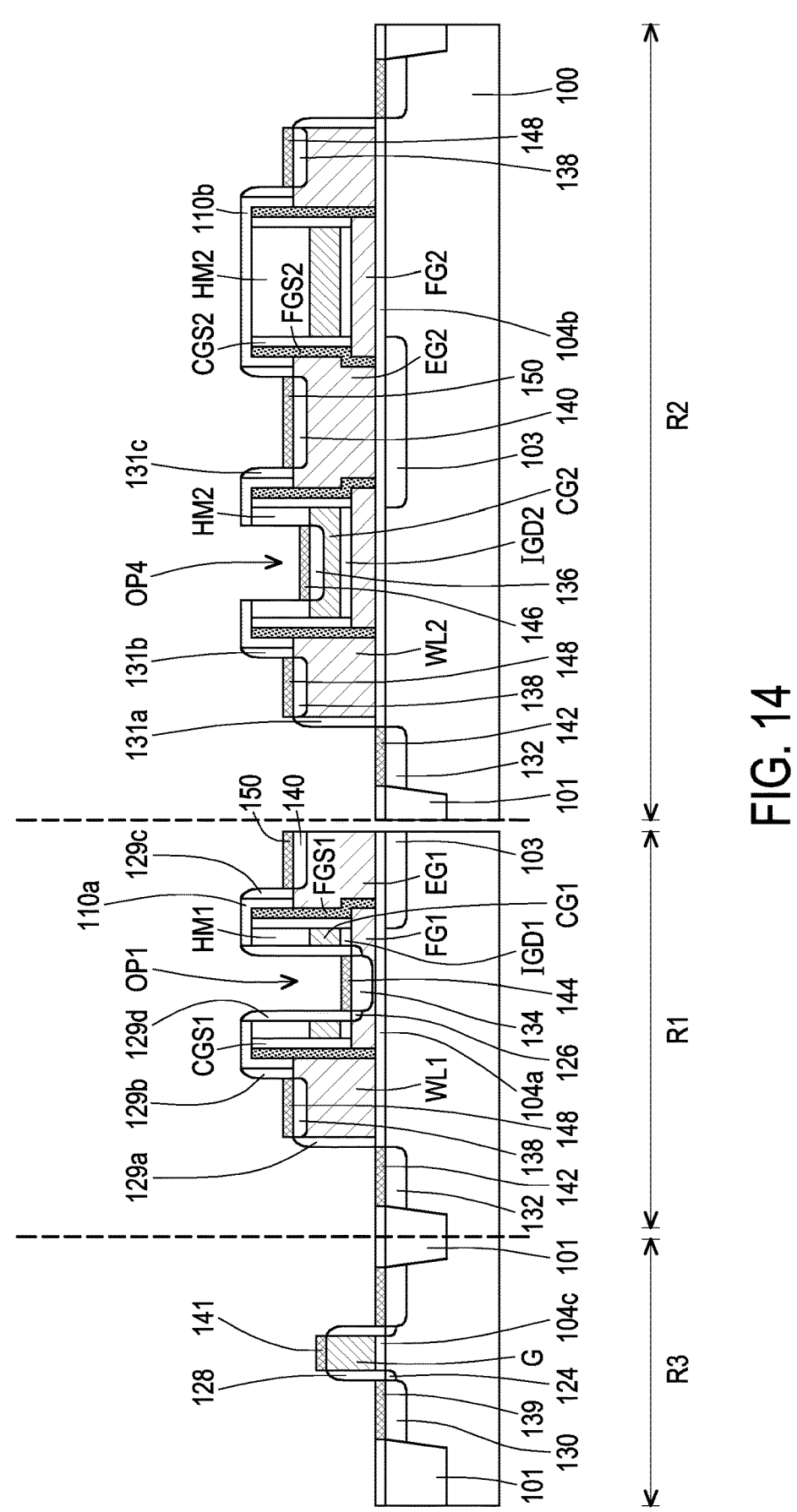

Referring to FIG. 14, metal silicide layers 139 are formed on the doped regions 130 and a metal silicide layer 141 is formed on the gate G in the logic region R1. During the formation of the metal silicide layers 139 and 141, metal silicide layers 142 are formed in the substrate 100 at two sides of the word lines WL1 and WL2 in the memory region R1 and memory region R2.

During the formation of the metal silicide layers 139 and 141, a metal silicide layer 144 is formed on the doped region 134 exposed by the opening OP1 in the memory region R1, and a metal silicide layer 146 is formed in the control gate CG2 exposed by the opening OP4 in the memory region R2. The metal silicide layer 144 can reduce the resistance between the subsequently formed floating gate contact and the floating gate FG1, and the metal silicide layer 146 can reduce the resistance between the subsequently formed control gate contact and the control gate CG2.

In addition, during the formation of the metal silicide layers 139, 141, metal silicide layers 148 are formed on the doped regions 138 of the word line WL1, WL2 in the memory regions R1, R2, and metal silicide layers 150 are formed on the doped regions 140 of the erase gates EG1, EG2 in the memory regions R1, R2. The metal silicide layers 148 can reduce the resistance between the subsequently formed word line contacts and the word lines WL1, WL2, and the metal silicide layers 150 can reduce the resistance between the subsequently formed erase gate contacts and the erase gates EG1, EG2.

The method for forming the above metal silicide layers includes: removing oxide from the corresponding doped regions; forming a metal layer on the substrate; performing a silicide process to make portions of the metal layer react with silicon in the corresponding doped regions to form metal silicide layers; and removing the unreacted metal layer. The metal silicide layers include nickel silicide, cobalt silicide, or the like.

Figure 15:
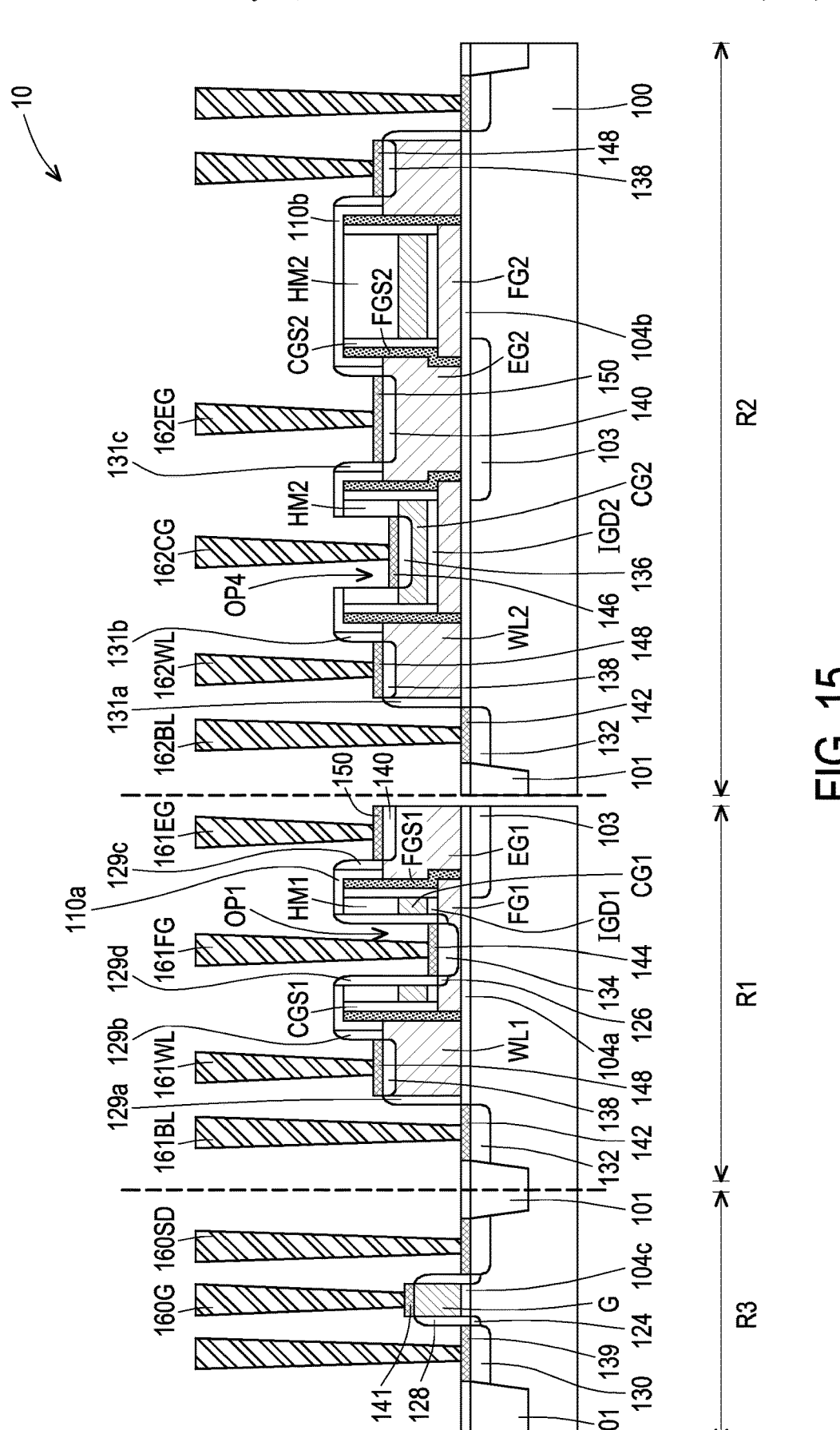

Referring to FIG. 15, a floating gate contact 161FG is formed in the opening OP1 in the memory region R1, and the floating gate contact 161FG is landed on the floating gate FG1. In the present disclosure, with the disposition of the floating gate contact 161FG, the equivalent oxide thickness (EOT) of the oxide layer around the floating gate FG1 (including the overlying inter-gate dielectric layer IGD1, the underlying dielectric layer 104a, and the floating gate spacer FGS1) can be monitored in real time, so as to ensure the performance of the semiconductor device.

During the formation of the floating gate contact 161FG, a bit line contact 161BL, a word line contact 161WL, and an erase gate contact 161EG are formed, which are respectively landed on the doped region 132, the word line WL1, and the erase gate EG1.

During the formation of the floating gate contact 161FG in memory region R1, a bit line contact 162BL, a word line contact 162WL, and an erase gate contact 162EG are formed in memory region R2, which are respectively landed on the doped region 132, the word line WL2, and the erase gate EG2.

During the formation of the floating gate contact 161FG in memory region R1, a contact 160G and contacts 160SD are formed in the logic region R3, which are landed on the gate G1 and doped regions 130 respectively. The semiconductor device 10 of the present disclosure is thus completed.

Hereinafter, the structure of the semiconductor device of the present disclosure will be described with reference to FIG. 15. A semiconductor device 10 includes a substrate 100 having a memory region R1. The memory region R1 includes a dielectric layer 104a, a floating gate FG1, an inter-gate dielectric layer IGD1, a control gate CG1 and a contact 161FG. The dielectric layer 104a is disposed on the substrate 100. The floating gate FG1 is disposed on the dielectric layer 104a. The inter-gate dielectric layer IGD1 is disposed on the floating gate FG1. The control gate CG1 is disposed on the inter-gate dielectric layer IGD1. The contact 161FG penetrates through the control gate CG1 and the inter-gate dielectric layer IGD1, and is landed on the floating gate FG1. In an embodiment, the memory region R1 is a dummy memory region.

In an embodiment, the semiconductor device 10 further includes a hard mask layer HM1 disposed on the control gate CG1, wherein the contact 161FG further penetrates through the hard mask layer HM1.

In an embodiment, the semiconductor device 10 further includes a spacer 129d disposed between the control gate CG1 and the contact 161FG and landed on the floating gate FG1. The top of the spacer 129d is higher than the top of the hard mask layer HM1. In an embodiment, an interlayer dielectric layer (not shown) is disposed between the spacer 129d and the contact 161FG, and is in physical contact with the spacer 129d and the contact 161FG.

In an embodiment, the semiconductor device 10 further includes a word line WL1 and an erase gate EG1 disposed on dielectric layer 104a, the floating gate FG1 is located between the word line WL1 and the erase gate EG1, and the floating gate EG1 is separated from the word line WL1 and the erase gate EG1 by spacers CGS1 and FGS1.

In an embodiment, the semiconductor device 10 further includes a doped region 126 and/or a doped region 134 disposed in the floating gate FG1 below the contact 161FG. In an embodiment, the doped region 126 further extends below the spacer 129d. In an embodiment, the dopant concentration and depth of the doped region 134 are greater than the dopant concentration and depth of the doped region 126.

In an embodiment, the semiconductor device 10 further includes a metal silicide layer 144 disposed between the contact 161FG and the doped region 126/134, and in physical contact with the contact 161FG and the doped region 126/134. In an embodiment, the metal silicide layer 144 is in physical contact with the spacer 129d. In an embodiment, the semiconductor device 10 further includes a contact 161WL and a contact 161EG, which are landed on the word line WL1 and the erase gate EG1 respectively. Doped regions 138 and 140 are respectively located on the surfaces of the word line WL1 and the erase gate EG1, and metal silicide layers 148 and 150 are respectively located between the doped regions 138 and 140 and the contacts 161WL and 161EG.

In an embodiment, the substrate 100 further has a memory region R2. In an embodiment, the memory region R2 is an active memory region. The memory region R2 includes a dielectric layer 104b, a floating gate FG2, an inter-gate dielectric layer IGD2, a control gate CG2 and a contact 162CG. The dielectric layer 104b is disposed on the substrate 100. The floating gate FG2 is disposed on the dielectric layer 104b. The inter-gate dielectric layer IGD2 is disposed on the floating gate FG2. The control gate CG2 is disposed on the inter-gate dielectric layer IGD2. A contact 162CG is landed on the control gate CG2. In an embodiment, the semiconductor device 10 further includes a metal silicide layer 146 disposed between the contact 162CG and the doped region 136 and in physical contact with the contact 162CG and the doped region 136. In an embodiment, the metal silicide layer 146 is in physical contact with the hard mask layer HM2.

In an embodiment, the semiconductor device 10 further includes a word line WL2 and an erase gate EG2 disposed on dielectric layer 104b, the floating gate FG2 is located between the word line WL2 and the erase gate EG2, and the floating gate EG2 is separated from the word line WL2 and the erase gate EG2 by spacers CGS2 and FGS2.

In an embodiment, the semiconductor device 10 further includes a contact 162WL and a contact 162EG, which are landed on the word line WL2 and the erase gate EG2 respectively. Doped regions 138 and 140 are respectively located on the surfaces of the word line WL2 and the erase gate EG2, and metal silicide layers 148 and 150 are respectively located between the doped regions 138 and 140 and the contacts 162WL and 162EG.

In an embodiment, the substrate 100 further has a logic region R3. The logic region R3 includes a gate dielectric 104c, a gate G, a contact 160G and contacts 160SD. The gate dielectric 104c is disposed on the substrate 100. The gate G is disposed on the gate dielectric 104c. In an embodiment, the top of gate G is lower than the top of control gate CG1. The contact 160G is landed on the gate G. The contacts 160SD are landed on the doped regions 130. In an embodiment, the semiconductor device 10 further includes a metal silicide layer 141 disposed between the contact 160G and the gate G, and in physical contact with the contact 160G and the gate G. In an embodiment, the semiconductor device 10 further includes metal silicide layers 139 disposed between the contacts 160SD and the doped regions 130 and in physical contact with the spacer 128 and the shallow trench isolation structure 101.

Based on the above, in the present disclosure, with the disposition of the floating gate contact, the equivalent oxide thickness (EOT) of the oxide layer around the floating gate (including the overlying inter-gate dielectric layer, the underlying dielectric layer, and the floating gate spacer) can be monitored in real time, so as to ensure the performance of the semiconductor device.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:

1. A semiconductor device, comprising:
a substrate, having a first memory region,
wherein the first memory region comprises:
a first dielectric layer, disposed on the substrate;
a first floating gate, disposed on the first dielectric layer;
a first inter-gate dielectric layer, disposed on the first floating gate;
a first control gate, disposed on the first inter-gate dielectric layer; and a first contact, penetrating through the first control gate and the first inter-gate dielectric layer, and landed on the first floating gate, and
the substrate further comprises a second memory region, wherein the second memory region comprises:
a second dielectric layer, disposed on the substrate;
a second floating gate, disposed on the second dielectric layer;
a second inter-gate dielectric layer, disposed on the second floating gate;
a second control gate, disposed on the second inter-gate dielectric layer; and
a second contact, landed on the second control gate.

2. The semiconductor device of claim 1, further comprising:
a first hard mask layer, disposed on the first control gate, wherein the first contact further penetrates through the first hard mask layer.

3. The semiconductor device of claim 2, further comprising:
a first spacer, disposed between the first control gate and the first contact, and landed on the first floating gate.

4. The semiconductor device of claim 3, wherein a top of the first spacer is higher than a top of the first hard mask layer.

5. The semiconductor device of claim 1, wherein the first memory region is a dummy memory region.

6. The semiconductor device of claim 1, further comprising:
a first word line and a first erase gate, disposed on the first dielectric layer, wherein the first floating gate is located between the first word line and the first erase gate, and the first floating gate is separated from the first word line and the first erase gate.

7. The semiconductor device of claim 1, further comprising:
a doped region, disposed in the first floating gate below the first contact.

8. The semiconductor device of claim 7, further comprising:
a metal silicide layer, disposed between the first contact and the doped region.

9. The semiconductor device of claim 1, wherein the substrate further comprises a logic region,
wherein the logic region comprises:
a gate dielectric layer, disposed on the substrate; and
a gate, disposed on the gate dielectric layer,
wherein a top of the gate is lower than a top of the first control gate.

* * * * *